US012729106B2

(12) United States Patent
Reddy

(10) Patent No.: US 12,729,106 B2
(45) Date of Patent: Sep. 8, 2026

(54) MICROSCALE FLEXIBLE STRAIN SENSOR

(71) Applicant: CARNEGIE MELLON UNIVERSITY, Pittsburgh, PA (US)

(72) Inventor: Jay Reddy, Pittsburgh, PA (US)

(73) Assignee: CARNEGIE MELLON UNIVERSITY, Pittsburgh, PA (US)

( * ) Notice: Subject to any disclaimer, the term of this patent is extended or adjusted under 35 U.S.C. 154(b) by 0 days.

(21) Appl. No.: 18/727,548

(22) PCT Filed: Mar. 28, 2023

(86) PCT No.: PCT/US2023/016516

§ 371 (c)(1),
(2) Date: Jul. 9, 2024

(87) PCT Pub. No.: WO2023/192238

PCT Pub. Date: Oct. 5, 2023

(65) Prior Publication Data

US 2025/0122073 A1 Apr. 17, 2025

Related U.S. Application Data

(60) Provisional application No. 63/324,839, filed on Mar. 29, 2022.

(51) Int. Cl.

*B81B 3/00* (2006.01)
*B81C 1/00* (2006.01)
*G01B 7/16* (2006.01)

(52) U.S. Cl.

CPC .......... *B81B 3/007* (2013.01); *B81C 1/00682* (2013.01); *G01B 7/22* (2013.01);

(Continued)

(58) Field of Classification Search

CPC ............ B81B 3/007; B81B 2201/0292; B81B 2203/0136; B81B 2203/04;

(Continued)

(56) References Cited

U.S. PATENT DOCUMENTS 6,140,707 A * 10/2000 Plepys .................... H01L 21/50 257/668
6,353,690 B1 3/2002 Kulishov (Continued)

FOREIGN PATENT DOCUMENTS

CN 105021120 A 11/2015
WO 2009124287 A1 10/2009

(Continued)

OTHER PUBLICATIONS

Wang et al., "A Thin-Film Cochlear Electrode Array With Integrated Position Sensing," Journal of Microelectromechanical Systems, vol. 18, Issue 2: 385-395 (Apr. 2009).

(Continued)

*Primary Examiner* — Nathaniel T Woodward

(74) *Attorney, Agent, or Firm* — KDW FIRM PLLC

(57) ABSTRACT

Disclosed herein are devices comprising stretchable interdigitated electrode arrays and methods for fabricating the devices. The devices are capable of acting as elongation sensors by sensing a change in the capacitance of the device as the distance between the interdigitated fingers changes when the device is elongated or compressed. The device may be coupled to other devices such as to be able to sense elongation or compression of the coupled device. The interdigitated fingers of the device are supported by a substrate and may be fabricated using traditional microfabrication techniques.

24 Claims, 3 Drawing Sheets

(52) U.S. Cl.
CPC ................ *B81B 2201/0292* (2013.01); *B81B 2203/0136* (2013.01); *B81B 2203/04* (2013.01); *B81B 2207/07* (2013.01); *B81C 2201/013* (2013.01); *B81C 2201/0156* (2013.01); *B81C 2201/0174* (2013.01)

(58) Field of Classification Search
CPC ........... B81B 2207/07; B81C 1/00682; B81C 2201/013; B81C 2201/0156; B81C 2201/0174; G01B 7/22; H01G 5/011
USPC ........................................................... 73/780
See application file for complete search history.

(56) References Cited

U.S. PATENT DOCUMENTS 6,532,824 B1 * 3/2003 Ueno .................... G01P 15/125 73/780
9,062,960 B2 6/2015 Rubio Guivernau
9,192,314 B2 11/2015 McLaughlin
9,261,350 B2 2/2016 Rubio Guivernau
9,486,641 B2 11/2016 Tolosa
9,529,433 B2 * 12/2016 Shankar .................. G06F 3/014
9,649,503 B2 5/2017 Delp
9,662,508 B2 5/2017 Delp
9,690,093 B2 6/2017 Margallo Balbas
9,700,736 B2 7/2017 Seymour
9,814,900 B2 11/2017 Lundmark
9,821,170 B2 11/2017 Lundmark
10,004,917 B2 6/2018 Li
10,022,552 B2 7/2018 Stahler
10,022,553 B2 7/2018 Lundmark
10,105,550 B2 10/2018 Stahler
10,188,870 B2 1/2019 Lundmark
10,213,617 B2 2/2019 Lundmark
10,232,583 B2 3/2019 Clough
10,481,336 B2 11/2019 Menard
10,512,787 B2 12/2019 Delp
11,125,948 B2 9/2021 Menard
11,169,326 B2 11/2021 Huang
11,277,695 B2 3/2022 Hillbratt
11,305,109 B2 4/2022 Heasman
11,318,298 B2 5/2022 Koka
11,385,400 B2 7/2022 Wheeler
11,439,811 B2 9/2022 de Miguel, Sr.
11,484,218 B2 11/2022 Johnston
11,660,115 B2 5/2023 Hanson
11,860,415 B2 1/2024 Huang
2002/0187350 A1 12/2002 Saccomanno
2005/0008848 A1 1/2005 Saccomanno
2005/0167702 A1 8/2005 Booth
2006/0198569 A1 9/2006 Ohtsu
2008/0179404 A1 * 7/2008 Finn ................ G06K 19/07745 438/759
2009/0158856 A1 * 6/2009 Harish .................... G01L 1/142 324/660
2011/0066160 A1 3/2011 Simaan
2012/0287420 A1 11/2012 McLaughlin
2013/0030352 A1 1/2013 Seymour
2013/0046148 A1 2/2013 Tathireddy
2013/0062457 A1 3/2013 Deakin
2013/0131868 A1 5/2013 Rucker
2013/0201485 A1 8/2013 Rubio-Guivernau
2014/0277296 A1 9/2014 Tolosa
2015/0018901 A1 1/2015 Li
2015/0126900 A1 5/2015 Walraevens et al.
2015/0202456 A1 7/2015 Andersen
2015/0238765 A1 8/2015 Zhu
2015/0246242 A1 9/2015 Delp
2015/0247720 A1 9/2015 Rubio Guivernau
2015/0283397 A1 10/2015 Andersen
2015/0283398 A1 10/2015 Andersen
2015/0359484 A1 12/2015 Bitzer
2015/0360049 A1 12/2015 Kaplitt
2015/0360050 A1 12/2015 Kaplitt
2015/0373831 A1 * 12/2015 Rogers .................. H01M 10/02 29/829
2016/0030765 A1 2/2016 Towne
2016/0038755 A1 2/2016 Lundmark
2016/0038756 A1 2/2016 Andersen
2016/0038757 A1 2/2016 Stahler
2016/0038758 A1 2/2016 Stahler
2016/0038759 A1 2/2016 Andersen
2016/0038765 A1 2/2016 Delp
2016/0045764 A1 2/2016 Delp
2016/0045765 A1 2/2016 Lundmark
2016/0051828 A1 2/2016 Stahler
2016/0051830 A1 2/2016 Andersen
2016/0051831 A1 2/2016 Lundmark
2016/0051836 A1 2/2016 Lundmark
2016/0051837 A1 2/2016 Delp
2016/0051838 A1 2/2016 Stahler
2016/0059030 A1 3/2016 Huang
2016/0073887 A1 3/2016 Lee
2016/0096034 A1 4/2016 Lundmark
2016/0096035 A1 4/2016 Lundmark
2016/0109699 A1 4/2016 Balbas
2017/0087193 A1 3/2017 Marinakis
2017/0182191 A1 6/2017 Towne
2017/0225008 A1 8/2017 Stahler
2017/0225009 A1 8/2017 Delp
2017/0225013 A1 8/2017 Delp
2017/0239488 A1 8/2017 Stahler
2018/0028832 A1 2/2018 Lundmark
2018/0056085 A1 3/2018 Lundmark
2018/0133501 A1 5/2018 Stahler
2018/0136389 A1 5/2018 Wheeler
2018/0140829 A1 5/2018 Ramos de Miguel, Sr
2018/0140862 A1 5/2018 Stahler
2018/0214711 A1 8/2018 Stahler
2018/0280716 A1 10/2018 Stahler
2018/0296243 A1 10/2018 Hanson
2018/0299622 A1 10/2018 Menard
2018/0345033 A1 12/2018 Lundmark
2018/0361169 A1 12/2018 Delp
2019/0015677 A1 1/2019 Stahler
2019/0038908 A1 2/2019 Lundmark
2019/0099611 A1 4/2019 Lundmark
2019/0105507 A1 4/2019 Stahler
2019/0117993 A1 4/2019 Lundmark
2019/0160300 A1 5/2019 Delp
2019/0224492 A1 7/2019 Delp
2019/0240500 A1 8/2019 Lundmark
2019/0265411 A1 8/2019 Huang
2019/0293838 A1 9/2019 Haba
2019/0388700 A1 12/2019 Delp
2020/0009397 A1 1/2020 Lundmark
2020/0022601 A1 1/2020 Rogers
2020/0049892 A1 2/2020 Menard
2020/0139151 A1 5/2020 Lundmark
2020/0144162 A1 5/2020 Chaowasakoo
2020/0229704 A1 7/2020 Lee
2022/0043209 A1 2/2022 Huang
2023/0371981 A1 11/2023 Hanson

FOREIGN PATENT DOCUMENTS

WO 2011053766 A1 5/2011
WO 2015003185 A2 1/2015
WO 2020035852 A2 2/2020
WO 2021038400 A1 3/2021
WO 2021038416 A1 3/2021
WO 2021127738 A1 7/2021
WO WO-2022023482 A1 * 2/2022 ........... G01Q 10/045
WO 2022058840 A1 3/2022

OTHER PUBLICATIONS

Extended European Search Report in EP Application No. 23776828.8 dated Sep. 26, 2025, 11 pages.

International Search Report and Written Opinion of the International Searching Authority for International Application No. PCT/US2023/016522, mailed Jul. 3, 2023, 8 pages.

(56) References Cited

OTHER PUBLICATIONS

International Search Report and Written Opinion of the International Searching Authority for International Application No. PCT/US2023/016517, mailed Jul. 10, 2023, 8 pages.
International Search Report and Written Opinion of the International Searching Authority for International Application No. PCT/US2023/016519, mailed Aug. 24, 2023, 11 pages.
International Preliminary Report on Patentability for International Application No. PCT/US2023/016519, mailed Nov. 14, 2024, 28 pages.
Chamanzar et al., "Ultrasonic sculpting of virtual optical waveguides in tissue," Nature Communications, vol. 10, No. 92 (2019).
Edrei et al., "The overwhelming role of ballistic photons in ultrasonically guided light through tissue," Nature Communications, vol. 13, No. 1873 (2022).
Kee et al., "Design and fabrication of Poly(dimethylsiloxane) arrayed waveguide grating," Opt Express, vol. 18, No. 21: 21732-21742 (Oct. 2010).
Kuo et al., "Novel flexible Parylene neural probe with 3D sheath structure for enhancing tissue integration," Lab Chip, vol. 13: 554-561 (2013).
Libbrecht et al., "Proximal and distal modulation of neural activity by spatially confined optogenetic activation with an integrated high-density optoelectrode," J Neurophysiol, vol. 120, No. 1: 149-161 (Jul. 2018).
Prajzler et al., "Flexible multimode polydimethyl-diphenylsiloxane optical planar waveguides," J. Mater Sci: Mater Electron, vol. 29: 5878-5884 (2018).
Reddy et al., "High Density, Double-Sided, Flexible Optoelectronic Neural Probes with Embedded μLEDs," Frontiers in Neuroscience, vol. 13: 745 (2019) <doi: 10.3389/fnins.2019.00745 >.
Reddy et al., "Low-loss flexible Parylene photonic waveguides for optical implants," Optics Letters, vol. 43, No. 17: 4112-4115 (Sep. 2018).
Reddy et al., "Parylene Photonic Waveguides with Integrated Vertical Input/Output Ports for Flexible, Biocompatible Photonics," In: 20th International Conference on Solid-State Sensors, Actuators and Microsystems & Eurosensors, 2448-2451 (Jun. 2019) <doi: 10.1109/TRANSDUCERS.2019.8808541 >.
Reddy et al., "Parylene photonics: a flexible, broadband optical waveguide platform with integrated micromirrors for bioInterfaces," Mirosystems & Nanoengineering, vol. 6, No. 85 (2020).
Scopelliti et al., "Ultrasonically sculpted virtual relay lens for in situ microimaging," Light Science & Applications, vol. 8, No. 65 (2019).
Wiesmayret et al., "A polydimethylsiloxane (PDMS) Waveguide Sensor that Mimics a Neuromast to Measure Fluid Flow Velocity," Sensors (Basel), vol. 19, No. 4: 925 (Feb. 2019).
Zuo et al., "Low loss, flexible single-mode polymer photonics," Opt. Express, vol. 27: 11152-11159 (2019).
International Search Report and Written Opinion of the International Searching Authority for International Application No. PCT/US23/16516, mailed Aug. 23, 2023, 9 pages.
Li et al., "Interdigital capacitive strain gauges fabricated by direct-write thermal spray and ultrafast laser micromachining," Sensors and Actuators A, vol. 133: 1-8 (2007).
Zeiser et al., "Capacitive strain gauges on flexible polymer substrates for wireless, intelligent systems," Journal of Sensors and Sensor Systems, vol. 3: 77-86 (2014).
Extended European Search Report in EP Application No. 23781667.3 dated Mar. 5, 2026, 6 pages.

* cited by examiner

MICROSCALE FLEXIBLE STRAIN SENSOR

RELATED APPLICATIONS

This application is a national phase filing under 35 U.S.C. § 371 claiming the benefit of and priority to International Patent Application No. PCT/US23/16516, filed Mar. 28, 2023, entitled "MICROSCALE FLEXIBLE STRAIN SENSOR", which claims the benefit of U.S. Provisional Patent Application No. 63/324,839, filed Mar. 29, 2022, the contents of which are incorporated herein in their entirety.

BACKGROUND

Traditional resistive strain gauges measure elongation via changes in resistivity of a metal under strain. However, such sensors are not feasible to detect large amounts of elongation (i.e., $\varepsilon > 0.1$), as they are inherently limited by the low stretchability of the constituent metal traces. Recently, interdigitated electrode array (IDE) capacitive strain gauges have been introduced that measure strain via the changing capacitance of interdigitated electrodes as they are moved closer together or further apart.

To be stretchable, these sensors must be implemented using flexible conductive elastomer traces. Due to the molding and printing processes required for these materials, they are not compatible with traditional high-volume MEMS fabrication, and are limited to large feature sizes, requiring large-area sensors. 3D fabrication of out-of-plane wavey substrates has been demonstrated to increase the stretchability of IDE capacitive strain sensors implemented using metal traces, but this also increases the fabrication complexity and thickness of the devices.

SUMMARY

Described herein is a novel design of a microfabricated thin-film strain sensor and a method of fabricating the sensor. The sensor uses an interdigitated electrode array supported on a flexible substrate with in-plane trace routing to increase the device stretchability along the axis of elongation, with the fabrication accomplished using high-volume MEMS manufacturing techniques.

BRIEF DESCRIPTION OF THE DRAWINGS

By way of example, a specific exemplary embodiment of the disclosed system and method will now be described, with reference to the accompanying drawings, in which.

DETAILED DESCRIPTION

The IDE capacitive strain sensor is implemented via an n-finger IDE characterized by the finger width w, inter-finger gap g, finger height t, and finger length L. The number of fingers, finger width, inter-finger gap, finger height and finger length may be customized for different applications based on the sensitivity and area requirements of the sensor, as well as the fabrication resolution. There are trade-offs for selecting various parameters for the device. For example, increasing the number of fingers, the width of the fingers and the length of the fingers will increase the sensitivity of the device at the expense of a larger surface area. Smaller finger width and small gap sizes are desirable because of the reduced surface area of the device but are more expensive to microfabricate due to the need for finer manufacturing resolution and tighter tolerances. Thicker fingers also increase the sensitivity but increase the expense and complexity of thin-film fabrication, as well as increasing the device stiffness.

Figure 1A:
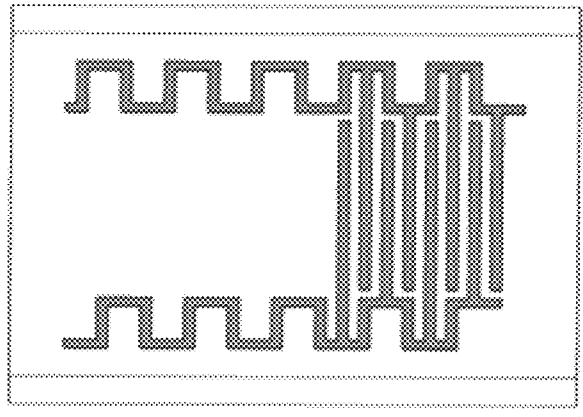
FIG. 1A is a schematic representation of a sensor in a neutral position.
Figure 1B:
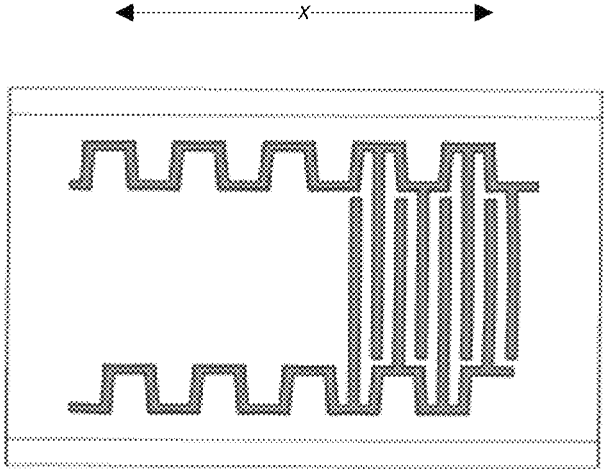
FIG. 1B is a schematic representation of the sensor in an elongated position.
Figure 2:
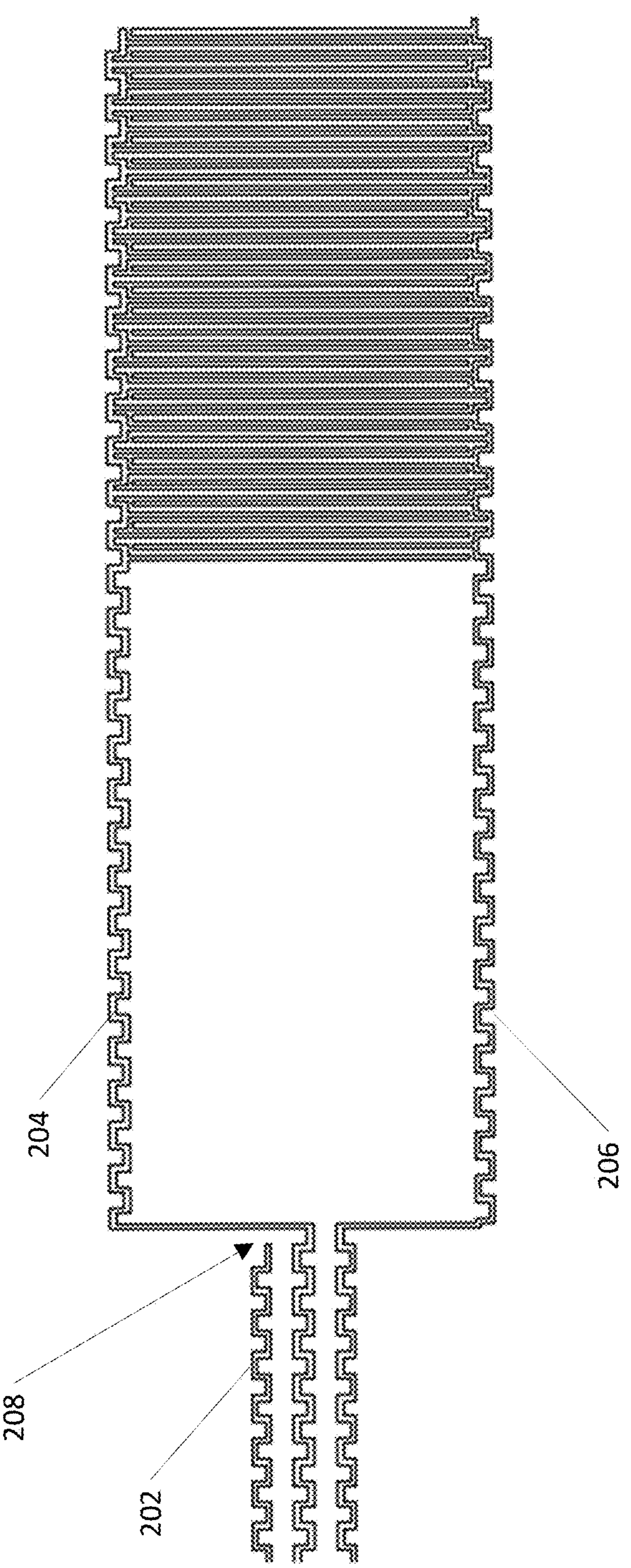
FIG. 2 shows the design of a large-scale sensor fabricated in accordance with embodiments disclosed herein.

Rather than using straight traces to connect the interdigitated fingers (i.e., ground and sense fingers) of the IDE, the design of embodiments disclosed herein make use of in-plane trace routing to reduce the stiffness of the sensor along the axis of elongation. An exemplary embodiment using a 1st order rectangular routing scheme is shown in FIG. 1A, showing the sensor in the neutral position. FIG. 1B shows the sensor of FIG. 1A in a position of partial elongation along the longitudinal axis (X). The rectangular trace routing reduces strain on the traces when the sensor is elongated. In other embodiments, higher-order self-similar routing and serpentine configurations may also be used. A first trace, shown as reference 204 in FIG. 2, is electrically coupled to a first sub-plurality of the fingers and a second trace, shown as reference 206 in FIG. 2, is electrically-coupled to a second sub-plurality of the fingers, wherein the first and second sub-pluralities are exclusive of each other. In embodiments disclosed herein one trace is a ground trace and the other trace is a sense trace. Preferably, fingers in the first sub-plurality will be disposed between two fingers in the second plurality (except at the ends of the array) and vise-versa, thus forming two sets of interdigitated fingers.

FIG. 2 shows an exemplary large-scale sensor fabricated in accordance with techniques disclosed herein. In this example, there are n=100 fingers. The sensor design is highly sensitive to parasitic capacitances. Therefore, the sensor can be employed in a single-ended sensing configuration or in a differential sensing configuration, where a 3rd reference trace 202 is routed in the cable and used in a differential scheme to compensate for the parasitic capacitance of the trace routing in a cable connecting the device to sensing circuitry, which can be considerable and may be highly-dependent on the environment in which the sensor is deployed. The reference trace 202 runs along trace 206 and through the cable. In the differential scheme, the capacitance is measured from the sensor plus the cable, and also from the cable alone, and the capacitance of the sensor can be isolated by taking the difference between the two measured capacitances. In some embodiments, reference trace 202 may be coupled (at location 208, for example) with a purposeful capacitor (i.e., a capacitor of a known capacitance) or other electrical element. The reference trace 202 is constructed in electrically conductive layer 108 and also exhibits self-similar routing, similar to the first and second traces.

Sensors in accordance with embodiments disclosed herein may be attached to various devices, for example, cochlear implants or catheters, to measure device deflection and forces exerted on the device. In various embodiments, multiple sensors can be employed in an array to achieve localized strain measurement. In yet other embodiments, different orientations of the sensors can be used to differentiate strain along multiple axes. For example, sensors may be placed having orthogonal axes of elongation such as to capture elongation in both "X" and "Y" directions. In yet other embodiments, the sensors may be placed at an angle relative to the axis of elongation such as to be able to sense elongation along both axes.

To measure the change in capacitance of the device, the device may be coupled to capacitive sensing circuitry (not shown) which is commercially available as an off-the-shelf item.

Figure 3:
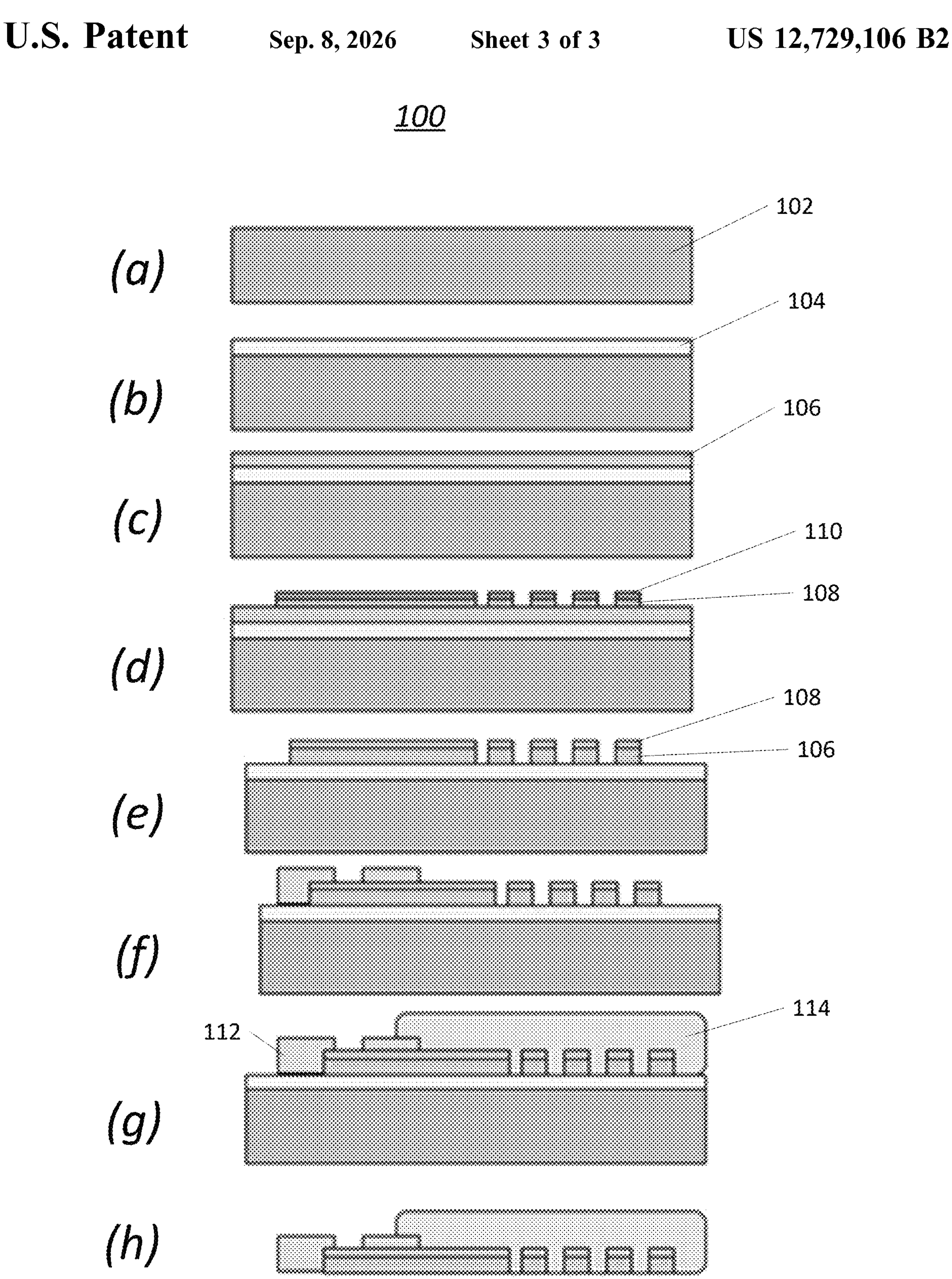
FIG. 3 shows steps (a-h) in one possible manufacturing process of the sensor.

An exemplary microfabrication process 100 to fabricate sensors in accordance with embodiments disclosed herein is shown in FIG. 3, which shows a cross-sectional view of the device in various stages of the fabrication process.

The process begins with a wafer 102 shown step (a). In preferred embodiments, wafer 102 is Si, although any suitable material may be used. In step (b), a release layer 104 is deposited on wafer 102. In one embodiment, release layer 104 may be composed of, for example, Ge, and may be 100 nm in height. As would be realized, any alternative release material known to those of skill in the art could be used. Release layer 104 may be sputtered onto the surface of wafer 102 or deposited via other similar methods (i.e., evaporation, chemical vapor deposition, or spin-coating).

In step (c), a substrate layer 106 is then deposited on release layer 104. In preferred embodiments, substrate layer 106 may be composed of a flexible polymer, for example, Parylene C. However, as would be realized by one of skill in the art, other materials may also be used for substrate layer 106, including, for example, silicone, SU-8, polyamide, $SiO_2$, SiN, PTFE, PET, PMMA, polyethylene, or similar materials. Substrate layer 106 may preferably be 2 microns in height, although other heights may be used. A thicker substrate layer 106 will add desirable mechanical robustness to the finger traces at the expense of the overall flexibility of the device. In some embodiments, the release layer 104 may be treated to increase adhesion to substrate layer 106 (i.e., using Silane A174 or an appropriate adhesion promotor for the chosen substrate material).

In step (d), an electrically conductive layer 108 is first deposited which will form the electrically conductive portions of the first and second traces 204, 206 and the reference trace 202. The electrically conductive layer 108 may be composed of, in various embodiments, Pt, Au, Cu, or combinations thereof. For example, electrically conductive layer 108 may be a 100 nm layer of Pt or may be a 5 nm layer of Pt and a 100 nm layer of Au. A hardmask trace 110 is then deposited over the electrically conductive layer 108. In alternate embodiments, the electrically conductive layer 108 may be Al, PEDOT or stacks of other conductive materials.

The hardmask 110 may be, for example, a 40 nm layer of Cr, however, as would be realized by one of skill in the art, other materials may also be used, for example, Al, photoresist, $SiO_2$, etc.

The trace geometry of the interdigitated electrode array is lithographically-defined and a trace stack of the electrically-conductive layer 108 and the hardmask 110 (e.g., Pt/Cr) is evaporated and lifted off. The lift-off process leaves individual stacks forming the fingers of the device and consisting of the substrate material 106 (e.g., Parylene C), the electrically-conductive layer 108 (i.e., Pt or Au) and the hardmask (e.g., Cr), as shown in step (d) in FIG. 3. In such an embodiment, Pt forms the trace material, whereas Cr is a hardmask for patterning the substrate layer 106, which is etched using the Cr hardmask. Etching may be performed using reactive ion etching, wet etching, or similar technique. Alternatively, the fingers may be formed via plasma or chemical etching or laser ablation.

The hardmask 110 is then stripped in step (e), leaving stacks consisting of material from the substrate layer 106 and the electrically-conductive layer 108 forming each of the plurality of fingers. The substrate layer 106 (e.g., Parylene C) only remains under the interdigitated electrode array fingers 108, and any of traces 202, 204, 206.

In step (f) of the process, optional stiffeners 112 may be added to the backend of the device to add strength once the device is released from the wafer 102. In preferred embodiments, stiffeners 112 may be composed of a negative photoresist (e.g., SU-8) and may be applied using lithography. In other embodiments, stiffeners 112 may be composed of Si, SiN, SU-8, Polyimide, Parylene C, or similar materials. In preferred embodiments, stiffeners 112 may be 7 microns in height, but as would be realized by one of skill in the art, any height is acceptable in accordance with the intended use of the device. Stiffeners 112 may be directly printed onto specific regions of the device or deposited and then patterned (i.e., via lithography, wet or dry etching, lift-off, or similar lithographically). In some embodiments, stiffeners 112 may be patterned to expose one or more bondpads to allow electrical connections thereto the first and second traces and the reference trace.

In step (g), the tops of the traces are encapsulated in layer 114. In one embodiment, encapsulation layer 114 is composed of silicone (polydimethylsiloxane—PDMS) which is spin-coated on the surface to form a substrate after release and insulate the tops of the traces. The encapsulation layer 114 extends between the interdigitated fingers of the sensor. Encapsulation layer 114 may be lithographically patterned and etched or lifted-off to expose the bondpads. The backend bondpads of the sensor may also be protected via Kapton tape or other means during PDMS deposition.

In step (h) the device is released from the silicon wafer 102 by laser-cutting the outline into the encapsulation layer 114 and dissolving the release layer 104. Alternative methods for patterning the encapsulation layer include patterning via wet or dry etching or liftoff. For example, in an embodiment wherein release layer 104 is Ge, a hydrogen peroxide solution may be used to dissolve the Ge.

The sensor may be adhered to other devices (i.e., the devices that are to be sensed, for example, a cochlear implant or catheter) by an adhesive, for example, a silicone adhesive, or the sensor may be incorporate directly into the manufacturing process of the sensed device. Alternatively, any means of coupling the sensor to the sensed device may be used.

The invention is contemplated to include both the devices and the process for manufacturing a multilayered device as described herein using microfabrication techniques. As would be realized by one of skill in the art, many variations on the process disclosed herein are possible and are contemplated to be within the scope of the invention. The scope of the invention is defined by the claims which follow.

The invention claimed is:

1. A microfabricated device comprising:
a plurality of interdigitated fingers;
wherein each finger forms an independent stack comprising:
a sub-layer composed of a polymer; and
a conductive layer disposed on the sub-layer;
wherein each finger is able to move with respect to each other along a longitudinal axis of the device.

2. The device of claim 1 further comprising:
a first serpentine-shaped electrically-conductive trace coupled to a first sub-plurality of the interdigitated fingers; and
a second serpentine-shaped electrically-conductive trace coupled to a second sub-plurality of the interdigitated fingers;

wherein the first and second sub-pluralities of interdigitated fingers are exclusive of each other.

3. The device of claim 2 wherein the first and second traces exhibit self-similar routing.

4. The device of claim 2 further comprising:

an encapsulation layer covering the plurality of interdigitated fingers and at least partially covering the first and second traces.

5. The device of claim 4 wherein the encapsulation layer extends between the interdigitated fingers.

6. The device of claim 5 wherein the encapsulation layer is composed of PDMS.

7. The device of claim 2 further comprising:

one or more stiffener layers covering at least a portion of the first and/or second traces.

8. The device of claim 7 wherein the one or more stiffener layers are etched to expose one or more bondpads electrically coupled to the first and second traces.

9. The device of claim 2 further comprising:

one or more bondpads electrically coupled to the first and second traces.

10. The device of claim 1 wherein the polymer sub-layer is composed of Parylene C.

11. The device of claim 1 wherein the conductive layer is composed of platinum, gold or a stack comprising layers of platinum and gold.

12. The device of claim 1 wherein changing the elongation of the device causes the device to exhibit a change in capacitance.

13. The device of claim 12 further comprising:

a reference trace allowing a differential measurement of the capacitance of the device.

14. A microfabricated device comprising:

one or more first fingers; and one or more second fingers;

wherein the one or more first fingers and the one or more second fingers are interdigitated;

wherein each of the one or more first fingers and the one or more second fingers comprise:

a sub-layer comprised of a polymer; and a conductive layer disposed on the sub-layer;

wherein the first fingers are able to independently move with respect to the second fingers along a longitudinal axis of the device, and wherein the second fingers are able to independently move with respect to the first fingers along the longitudinal axis of the device.

15. The device of claim 14 wherein each of the one or more first fingers and the one or more second fingers forms an independent stack.

16. The device of claim 14 further comprising:

a first electrically-conductive trace coupled to the one or more first fingers; and a second electrically-conductive trace coupled to the one or more second fingers.

17. The device of claim 16 wherein the first electrically-conductive trace is serpentine-shaped.

18. The device of claim 16 further comprising:

an encapsulation layer;

wherein the encapsulation layer at least partially covers the one or more first fingers and the one or more second fingers, and wherein the encapsulation layer at least partially covers the first electrically-conductive trace and the second electrically-conductive trace.

19. The device of claim 18 wherein the encapsulation layer extends between the one or more first fingers and the one or more second fingers.

20. The device of claim 18 further comprising:

a stiffener layer covering at least a portion of the first electrically-conductive trace.

21. The device of claim 14 wherein changing an elongation factor of the device causes the device to exhibit a change in capacitance.

22. A microfabricated device comprising:

a plurality of interdigitated fingers;

wherein each finger forms an independent stack, each independent stack comprising:

a sub-layer comprised of a polymer; and a conductive layer disposed on the sub-layer.

23. The microfabricated device of claim 22 wherein each of the plurality of interdigitated fingers are movable independent of one another along a longitudinal axis of the device.

24. The microfabricated device of claim 22 further comprising a serpentine-shaped electrically-conductive trace coupled to at least a sub-plurality the plurality of interdigitated fingers.

* * * * *